United States Patent [19]

Tom

[11] Patent Number: 5,210,700

[45] Date of Patent: May 11, 1993

[54] AUTOMATIC DELAY ADJUSTMENT FOR STATIC TIMING ANALYSIS

[75] Inventor: David Tom, Menlo Park, Calif.

[73] Assignee: International Business Machines Corporation, Armonk, N.Y.

[21] Appl. No.: 482,234

[22] Filed: Feb. 20, 1990

[51] Int. Cl.$^5$ .............................................. G06F 15/60
[52] U.S. Cl. .................................... 364/489; 364/488; 364/578
[58] Field of Search ................ 364/488, 489, 490, 578

[56] References Cited

U.S. PATENT DOCUMENTS

| | | | |
|---|---|---|---|
| 3,939,336 | 2/1976 | Vasiliev et al. | 235/184 |
| 4,263,651 | 4/1981 | Donath et al. | 364/491 |
| 4,527,249 | 7/1985 | Van Brunt | 364/578 |
| 4,635,218 | 1/1987 | Widdoes, Jr. | 364/578 |
| 4,656,592 | 4/1987 | Spaanenburg | 364/490 |
| 4,698,760 | 10/1987 | Lembach et al. | 364/490 |
| 4,815,016 | 3/1989 | Young | 364/578 |
| 4,821,220 | 4/1989 | Duisberg | 364/578 |
| 4,924,430 | 5/1990 | Zasio et al. | 364/578 |
| 5,077,676 | 12/1991 | Johnson et al. | 364/488 |

OTHER PUBLICATIONS

"Timing Influenced Layout Design" by Burstein et al; IEEE 22nd Design Automation Conf., 1985, pp. 124–130.

"Synchronous Path Analysis in MOS Circuit Simulator" by V. D. Agrawal, IEEE (9th Design Automation Conf., 1982, pp. 629–635.

*Primary Examiner*—Vincent N. Trans
*Attorney, Agent, or Firm*—Baker, Maxham, Jester & Meador

[57] ABSTRACT

Delay analysis in logic simulation is enhanced by providing, in a simulation model of a logic circuit, a timing delay tag on each circuit path connecting the output of a first with the input of the second circuit element. Each circuit leg is given a delay value and a clock phase tag providing information about how the delay value is clocked. The clock phase tags correspond to respective phases of a multi-phase circuit clock and relate the delay values to particular clock phases. The phase tag also indicates whether the signal on the data path is triggered by the rising or falling edge of the specified clock phase. At circuit nodes, clock phase tags are concatenated. Thus, if a clocked circuit element responds to an input signal which is a composite of several upstream output signals, the concatenated clock phase tags and delay values can be analyzed to determine if a timing adjustment is required. The information further supports the automatic adjustment of delay value, if needed.

14 Claims, 4 Drawing Sheets

Structure Table

| Source_blk | Output_pin | Sink_block | Input_pin |
|---|---|---|---|
| BLK1 | 30 | BLK4 | A0 |
| BLK2 | 30 | BLK4 | A1 |
| BLK4 | 10 | BLK3 | D0 |
| BLK4 | 10 | BLK5 | D0 |

Block Description Table

| Block | Block_type |
|---|---|
| BLK1 | LATCH |
| BLK2 | LATCH |
| BLK3 | LATCH |
| BLK4 | AND |
| BLK5 | LATCH |

Block Rule Table

35

| Block_type | Input_pin | Output_pin | Path_type | Blk_delay |
|---|---|---|---|---|
| LATCH | D0 | 10 | THROUGH | (2,3) |
|  | C0 | 10 | TRIGGERED | (5,6) |
|  | B0 | 30 | TRIGGERED | (5,6) |
| AND | A0 | 10 | THROUGH | (2,1) |
|  | A1 | 10 | THROUGH | (3,2) |

FIG. 6

Clock Description Table

| Clock | Rise_time | Fall_time | Cycle_length |
|---|---|---|---|
| T0 | 0 | 20 | 100 |
| T1 | 25 | 45 | 100 |
| T2 | 50 | 70 | 100 |
| T3 | 75 | 95 | 100 |

PATH DELAY TABLE

| Block | Pin | Clock_tag | Path_delay |
|---|---|---|---|
| BLK1 | D0 | ASYNC | (68,70) |
| BLK1 | C0 | T3 | (75,90) |
| BLK1 | B0 | T0 | (0,20) |
| BLK2 | D0 | ASYNC | (20,22) |
| BLK2 | C0 | T1 | (25,45) |
| BLK2 | B0 | T2 | (50,70) |
| BLK3 | C0 | T1 | (25,45) |
| BLK3 | B0 | T2 | (50,70) |
| BLK5 | C0 | T3 | (75,95) |
| BLK5 | B0 | T0 | (0,20) |
| BLK1 | I0 | T3 R | (80,81) |
| BLK1 | 30 | T0 R | (5,6) |
| BLK2 | I0 | T1 R | (30,31) |
| BLK2 | 30 | T2 R | (55,56) |
| BLK3 | D0 | T0 R | (7,7) |
| BLK3 | D0 | T2 R | (58,58) |
| BLK3 | I0 | T1 R | (30,31) |
| BLK3 | 30 | T2 R | (55,56) |
| BLK4 | A0 | T0 R | (5,6) |
| BLK4 | A1 | T2 R | (55,56) |
| BLK4 | I0 | T0 R | (7,7) |
| BLK4 | I0 | T2 R | (58,58) |
| BLK5 | D0 | T0 R | (7,7) |
| BLK5 | D0 | T2 R | (58,58) |
| BLK5 | I0 | T3 R | (80,81) |
| BLK5 | 30 | T0 R | (5,6) |

AUTOMATIC DELAY ADJUSTMENT FOR STATIC TIMING ANALYSIS

BACKGROUND OF THE INVENTION

This invention is in the field of logic timing analysis, and particularly concerns the problem in logic circuit timing analysis of adjusting a path delay to account for the effect of phase differences between clock signals which drive data signals on the path.

In static timing analysis, the logic design of a circuit is analyzed to identify timing problems in the design. The logic design is analyzed by propagating cumulative path delays from the inputs of the circuit to its outputs in a single pass. A timing problem arises at a point in the circuit which joins two circuit paths when the signal along one of the paths arrives at the point with an improper timing relationship to the signal along the second path.

Static timing analysis, therefore, concerns a point-by-point analysis of a logic circuit in which all possible paths to the current point are analyzed to detect timing problems. This is contrasted with dynamic timing analysis in which logic circuit operation is simulated. One example of static timing analysis is found in U.S. Pat. No. 4,263,651, which is commonly assigned with this application.

Static timing analysis proceeds by propagating maximum delays from the inputs to the outputs of a design in a single pass through the design. Assuming that the design includes clocked elements such as latches, the single-pass analysis means that such elements would be clocked only once during the analysis. If data is generated at the output pin of the clocked element (the "source" element) later than it is expected to be clocked into the input pin of the next downstream clocked element (the "sink" element), the data will appear to be too late from the standpoint of the sink latch. This anomaly is resolved by making a timing adjustment to the delay value which is propagated out of the output pin of the source latch. The timing adjustment is made by subtracting a clock cycle from the delay value so that the data will appear to have been clocked out of the output pin during the clock cycle preceding that during which it is clocked into the downstream input pin.

Figure 1:
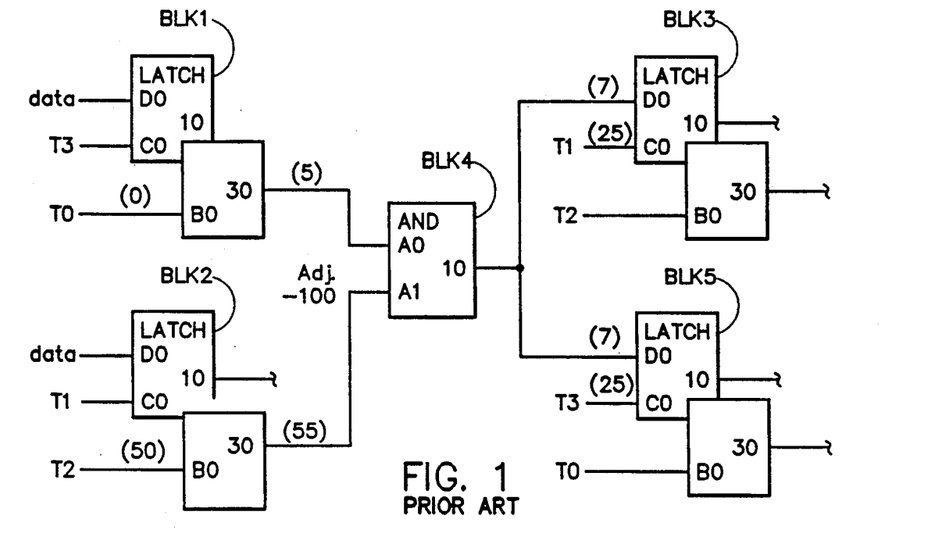
FIG. 1 is a representation of a logic network illustrating timing analysis by prior art static timing analysis method.

An example of the timing adjustment problem is illustrated in FIG. 1. FIG. 1 illustrates how delay adjustments are made according to prior art static timing analysis methods. FIG. 1 illustrates a logic circuit design consisting of a plurality of circuit elements, called "blocks". Each block represents a particular kind of logic element and includes one or more input ports on its left-hand side and one or more output ports on its right-hand side. In FIG. 1, two distinct kinds of circuit elements are illustrated. Blocks (BLKS) 1, 2, 3, and 5 are clocked circuit elements called latches. Each latch consists of two elements, one including a data input pin D0, a clock input pin C0, and an output pin 10. The second element has a data input internally connected to the first element and uses the B0 input pin for clocking into the second element. Each latch is fed a clock signal consisting of two clock waveforms. Data presented to the D0 input enters the first element while the clock input to the C0 input pin has a positive level. The data is latched or retained in the first element at the rising edge of the clock input to the C0 pin. The data in the second element is thus available as the output at the next rising edge of the clock waveform at the B0 input pin.

Block 4 is representative of non-clocked combinatorial logic elements such as gates, inverters, and the like. In FIG. 1, block 4 represents an AND gate with two input pins A0 and A1 and a single output pin 10.

In the logic design of FIG. 1, any block whose output is provided to an input of another block in the design is termed a "source" block. Any input pin in the logic design of FIG. 1 which does not receive a signal from a source block in the logic design is termed a "primary" input, while the output of any block in the logic design which is not connected to the input of another block in the same logic design is termed a "primary" output.

Figure 2:
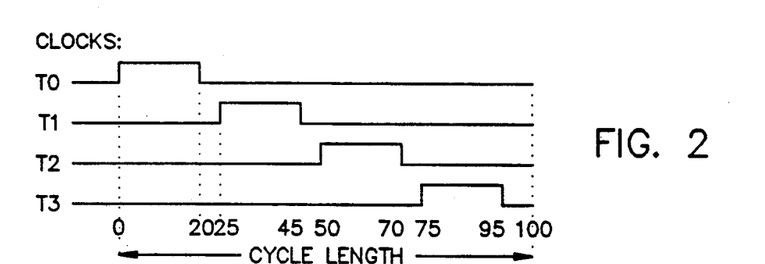
FIG. 2 is a set of clock waveforms illustrating a multi-phase clock which synchronizes operations of clocked elements of the logic network illustrated in FIG. 1.

The logic design of FIG. 1 employs multiple-phase system clocking in which the operations of clocked elements are controlled by a plurality of clock signals. These clock signals are illustrated in FIG. 2, and are interlaced in that all the clock signals have the same frequency, but separate respective phases. FIG. 2 illustrates four clocks T0, T1, T2, and T3. One system clock cycle of the logic design of FIG. 1 comprises an interlaced sequence of four staggered clock pulses, one from each of the respective clock signals T0-T3. The cycle length is 100 timing units; each clock signal has a pulse width of 20 timing units from rising to falling edge; and the falling edge of each clock signal is separated from the rising edge of the next clock signal by five timing units.

Returning to the description of timing adjustment according to prior art static timing analysis in FIG. 1, a goal of the procedure is to determine, for example, whether any timing problems exist between a data signal input to the input pin D0 of block 3 and the T1 clock input to the C0 input of the block. The analysis regards the arrival time of a signal produced from the output pin of block 4 with respect to the occurrence of the rising edge of the T1 clock. If the arrival time of the data signal precedes the rising edge of the T1 clock, the signal will be latched; otherwise, the rising edge of the T1 will latch an incorrect signal into the block. The output pin of block 4 produces the signal in response to signals produced by block 1 and block 2. Each of these signals has respective delay characteristics, and either can affect the output of block 4. Therefore, the timing analysis with respect to block 3 must take into consideration the fact that the output of block 4 can change at different times, depending upon the outputs of blocks 1 and 2.

As should be evident from the foregoing discussion, static timing analysis operates by tracing back the paths through the logic design from a point where the analysis is being conducted. Thus, if analysis is being conducted at the input of block 3, static timing analysis traces back the paths which feed input pin D0. The paths are rearwardly traced to those primary inputs which ultimately drive the pin of interest. In FIG. 1, T0 and T2 are the primary inputs which affect the signal input to pin D0 in block 3.

In prior art static timing analysis, once the primary inputs are identified, the paths beginning with those primary inputs are traced forward to the point of interest in the logic design while delay values are accumulated along the paths. In this regard, the number in parentheses in FIG. 1 represent the delay values that would be calculated by a static timing analysis program of the prior art. Consider, for example, the path from block 1 to block 3. The data is clocked out of block 1 by the clock T0 at time zero, with a delay through block 1 of five timing units. This delay value is denoted as (5) on the signal path connecting output pin 30 of block 1 to input pin A0 of block 4. Assuming a delay of two timing units through block 4, the total delay from block 1 to the data input pin of block 3 is 7 timing units.

Consider now the accumulated delay from block 2 to block 3. Output pin 30 of block 2 is clocked by the rising edge of clock T2, which is delayed by 50 timing units with respect to the beginning of a system clock cycle. Assuming delays of 5 timing units through block 2 and 2 timing units through block 4, a signal originating at block 2 will arrive at input pin D0 of block 3 with a delay of 62 timing units. Thus, data clocked out of block 2 by the clock T2 at time 50 will arrive at the input pin D0 of block 3 at time 62. Apparently, data is clocked out of block 2 later than it is expected to be clocked into block 3 by the rising edge of T1. Manifestly, the designer intends that data from the previous cycle of blocks is to be clocked into block 3. This intent is implemented by specifying an adjust value of −100 for the path from block 2 to block 3, which retards the delay value by one system clock cycle. The delay value will be denoted as (−43). In static timing analysis as presently practiced, this adjust value cannot simply placed at the input pin of block 3, because this would cause the path from block 1 to block 3 to be incorrectly adjusted. Therefore, it is necessary to follow the paths back from block 3 to the point at which they diverge to correctly place the adjust value. The correct placement of the adjust value is at A1 input to block 4 as illustrated in FIG. 1.

In a logic design with multi-phase clocks, many clocked elements, and many signal paths determining where an adjust value should be placed for static timing analysis is a difficult task. The adjust value must be placed so that the paths requiring an adjustment are adjusted, without affecting the paths not requiring adjustment. In fact, it may be the case in a logic configuration that an adjustment cannot be properly made because of conflicting adjust values. For example, consider block 5 in FIG. 1 where an adjust value is required at the A1 input to block 4 for the path from block 2 to block 3 as in the first example. However, the path from block 2 to block 5 does not require an adjust value because the data is clocked out of block 2 before being clocked into block 5. The requirement to adjust the delay value for the path from block 2 to block 3 does not apply to the path from block 2 to block 5. In this case, it is not possible to correctly analyze both paths in a single timing analysis run using previous static timing analysis tools.

The examples discussed with reference to FIG. 1 illustrate that generation of timing adjustments according to previous static timing analysis tools can be a complex, and potentially insoluble, problem. To set up timing adjustments required by previous static timing analysis tools, the designer must identify those paths requiring an adjustment, determine where along the path the adjust value can be placed so that other paths will be not incorrectly adjusted, and resolve any conflicting adjust values. This becomes more difficult as the amount of logic being analyzed increases. In addition to requiring a significant amount of effort, the prior art generation of timing adjustments is inconsistent and error prone and an incorrect set of timing adjust values can potentially hide an actual timing problem.

SUMMARY OF THE INVENTION

The invention is based upon the critical observation by the inventor that the prior art timing adjustment problem can be resolved by associating, with each delay value, information regarding the clock affecting the value. Now, when converging paths bring together multiple delay values, those multiple delay values can be propagated forwardly, one for each different clock, and the clock information can be used to automatically adjust the delay values, as needed.

The invention is practiced in a system for analyzing the operation of a multi-phase-clocked logic network under static conditions. The invention improves the analysis of signal delay through the logic network and includes a circuit simulation providing a logical counterpart of the logic network which represents a multi-phase clock, elements of the logic network and connections between those elements. The elements include clocked elements which responds to a particular phase of the multi-phase clock by accepting an input data signal.

The invention also includes a data object representing a data signal propagating through the logic network. The data object includes a first data field representing a phase of the multi-phase clock during which the represented data signal is generated and a second data field representing a delay time.

The system includes a propagation component for applying the data object to the clocked data element representation to simulate input of the data signal to the clocked element.

In the invention, a delay component cooperates with the propagating element by comparing the phase represented by the first data field with the representation of the particular phase to alter the second field to a value representing the cumulative delay of the data signal through the clocked element.

An objective of this invention is to provide for automatic adjustments of delay values propagated through a logic network design by a static timing analysis tool.

This and other important objectives are achieved by this invention, as will be appreciated by reading the following detailed description of the embodiment with reference to the below-described drawings.

DETAILED DESCRIPTION OF THE PREFERRED EMBODIMENT

The invention overcomes the timing adjustment problem of the prior art static timing analysis by automatically handling delay calculation and timing adjustments. This is done by (1) associating clock information with the delay values which are propagated through the logic design, (2) propagating multiple delay values downstream in the logic design from a point where different delay values converge, and (3) using the clock information associated with a delay to automatically adjust it as needed. An example of how the timing adjustment problem is handled by the invention is illustrated in FIG. 3.

Figure 3:
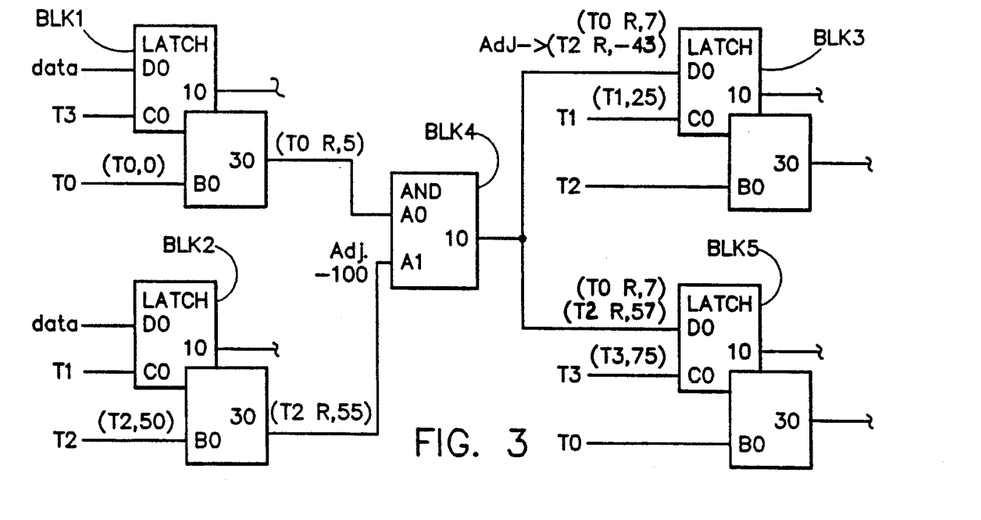
FIG. 3 illustrates how the invention is applied to the logic network of FIG. 1 to automatically identify where a delay value must be adjusted and to automatically adjust the delay value.

In FIG. 3, a clock tag is associated with each of the delay values. The clock tag provides information about how a signal represented by the delay value was generated by a clocked circuit element. In FIG. 3, a clock tag is simply the name of the clock signal which operates the clocked element generating the signal with which the clock tag is associated. For example, clock tags of the form T0 indicate that the delay value represents clock signal T0. Clock tags of the form T0 R indicate that the delay value represents a data signal which is triggered by the rising edge of the specified clock. In the example, the output of block 1 has a clock tag of T0 R, because the latch signal provided at output pin 30 is triggered by the rising edge of the T0 clock signal. Similarly, the output of block 2 has a clock tag T2 R, because the output signal is triggered by the rising edge of the T2 clock signal.

Multiple delay values are also propagated along a path, one for each different block tag. As FIG. 3 illustrates, the combinatorial clock represented by block 4 has several inputs, each with a different clock tag. In the invention, the output of such a block will have clock tag/delay value pairs propagated downstream, one pair for each clock tag. As FIG. 3 illustrates, the pairs are propagated from the output pin 10 of block 4, one pair for the T0 R clock tag and the other for the T2 R clock tag.

The clock tags and multiple delay values are used by the invention to calculate delays through circuit blocks and to automatically perform timing adjustment, as needed. The adjustment is done by comparing all clock phase tags provided to the data input of the latch with the clock phase tag of the triggering clock input. If one of the tags indicates that the associated data signal was triggered before the rising edge of the clock signal which triggers the latch, no adjust is required. If the clock tag indicates that the associated data signal was triggered after the clock signal triggering the latch, then the data delay value is automatically adjusted. The adjustments are determined independently for each of the clock tags.

In the example of FIG. 3, the delay for T0 R in block 3 does not require an adjustment because the signal represented by the clock tag/delay pair was triggered by the rising edge of T0, which occurs before the rising edge of the clock signal T1. However, the delay for T2 R in block 3 requires an adjustment because the represented data signal was triggered by the rising edge of T2, which occurs after the rising edge of the triggering clock signal T1. For block 5, the delays for both T0 R and T2 R do not require adjustment because the associated signals were triggered before the rising edge of the clock signal T3. FIG. 3 clearly indicates that the problem of conflicting adjustment values is eliminated by the invention because adjustment is done at the input of a latch to the representation of the data signal and is done independently of any other representation of the same data signal at another logic circuit element.

THE INVENTION

The invention is embodied in the data structures illustrated in FIGS. 4-8 and the pseudo-code description contained in Tables I-VI. An overall structural relationship between the data structures and the table procedures is illustrated in FIG. 9.

In FIGS. 4-8, five data tables are illustrated. FIGS. 4-7 contain the essential description of the logic circuit being analyzed. The table of FIG. 8 contains timing analysis data illustrated and discussed with reference to FIG. 3 and Tables I-VI.

Figure 4:
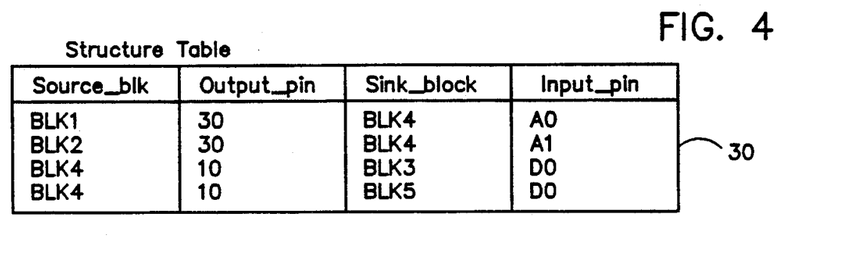
FIGS. 4–8 illustrate particular tables which are used in the practice of the invention.

In FIG. 4, a structure table 30 contains a description of the logic design being analyzed. The logic design (refer to FIG. 3) consists of blocks with output pins and input pins. Output pins are designated by a two-digit numeric name and input pins are designated by a two-character alpha-numeric name. The output pins of blocks are connected to the input pins of other blocks to form a directed graph. The structure table describes this graph by listing the connections between a source block output pin and the sink block input pin to which it is connected. For example, the output pins 30 of both blocks 1 and 2 respectively are connected to input pins A0 and A1 of block 4. Output 10 of block 4 sources input pin D0 of block 3 and block 5. Input pins of blocks which are not connected to any other block are considered primary input pins to the design. Therefore, input pins D0 of block 1 and 2 are primary input pins. Output pins of blocks which are not connected to any other block are considered primary outputs of the design. Therefore, output pins 30 of blocks 3 and 5 are primary outputs.

Figure 5:
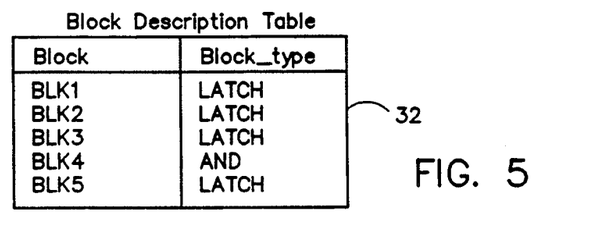

FIG. 5 illustrates a block description table 32 in which each block in the design is listed, together with a description of the block type. The block type identifies the logic function performed by the circuit block and is used to find the description of the block type in a block rule table, discussed below. The block description table 32 of FIG. 5 describes blocks 1, 2, 3, and 5 as latches, and block 4 as a combinatorial circuit of the AND gate type.

Figure 6:
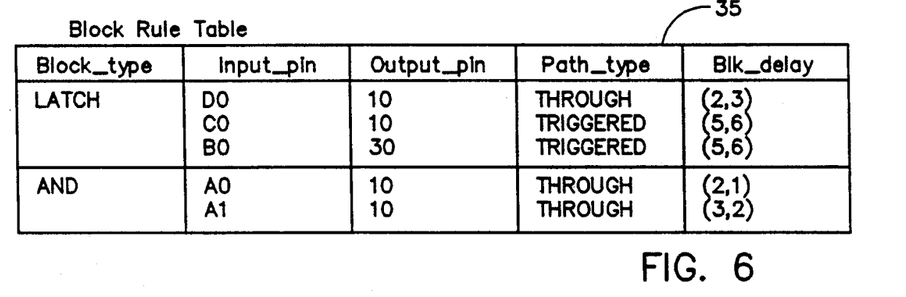

In FIG. 6, a block rule table 35 describes how the input pins of a block are connected to the output pins of a block for each block type. For each input pin-to-output pin connection, the block rule table lists a path type with a connection, and a block delay for the connection. The path type field of the table 35 describes how a signal propagates from the input to the output pin of a block. The path type field can be THROUGH or TRIGGERED. A THROUGH path type represents a combinatorial circuit type such as an AND block where the rising or falling signal on the input pin propagates through to the output pin to create a rising or falling signal on the output pin. A TRIGGERED path type represents an edge-triggered circuit type such as a latch block where the leading edge of the input signal creates both a rising and falling signal on the output pin and the falling edge of the input signal does not propagate to the output pin. The block delay (BLK_DELAY) field of the table is formed from a pair of numbers of the form (tplh, tphl) representing the amount of delay to be added to the rising and falling path delays of the input signal to calculate the path delay values at the output pin. The number tplh is the time required to propagate a low-to-high signal transition through the block, while the number tphl is the time required to propagate a high-to-low signal transition. The example block rule table in FIG. 6 shows the block rules for both latch and AND block types. For example, in a latch block type, the delay through the block for a low-to-high signal transition from the input pin B0 where a clock phase signal is connected to the output pin 30 is five timing units, while the delay for a high-to-low transition is six timing units.

Figure 7:
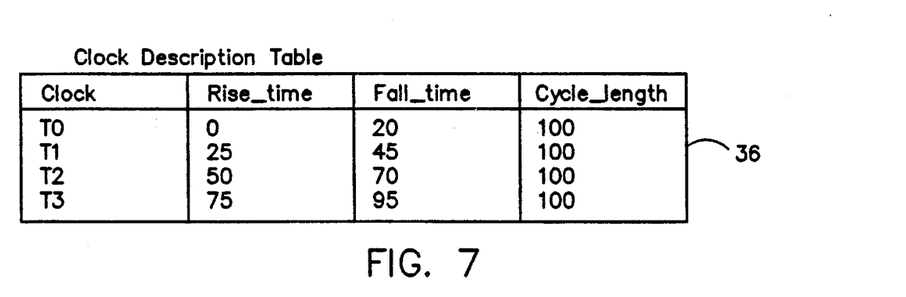

A clock description table 36 is illustrated in FIG. 7, the table defining the clock signals used in the logic design and the relationship between the clocks. Each clock signal used in the design is defined in the clock description table. Each clock signal is defined by its rise time, fall time, and cycle length in timing units. As inspection of the table 36 in FIG. 7 will confirm, the four clock signal of FIG. 2 are completely described in the table.

Figure 8:
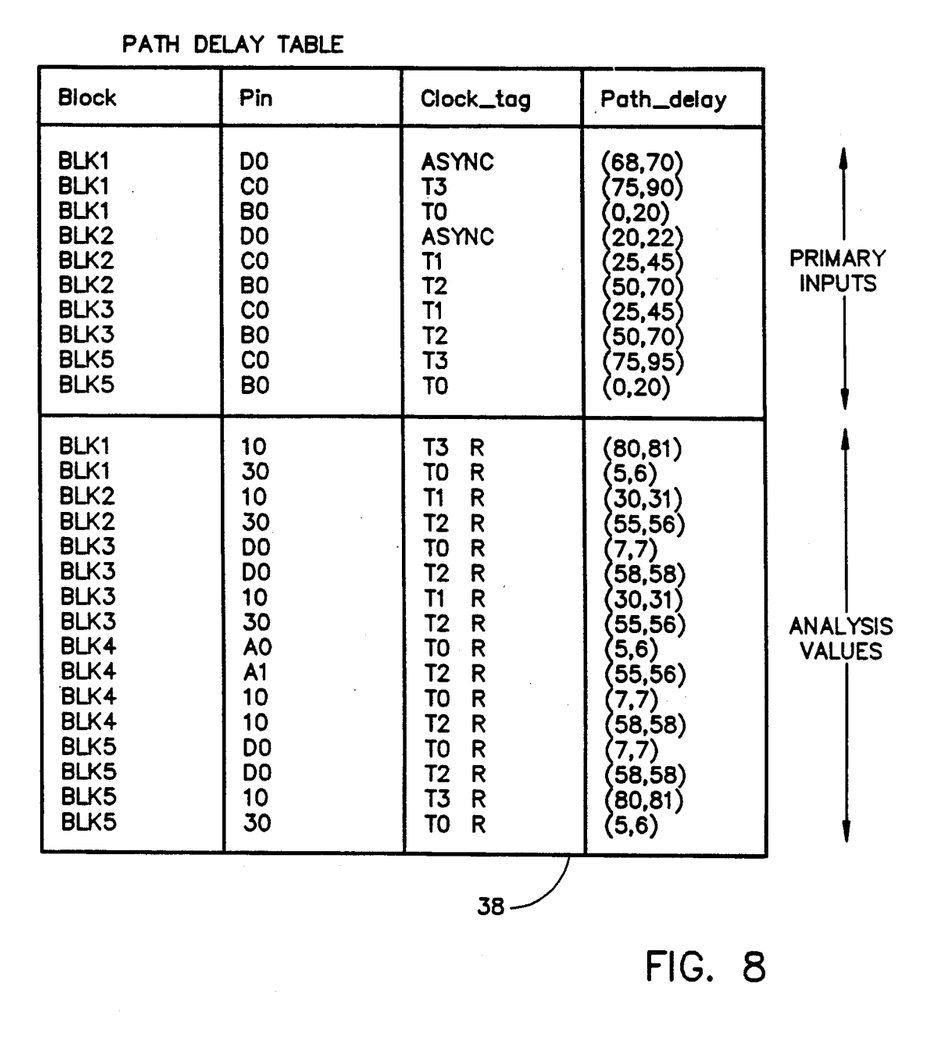
Figure 9:
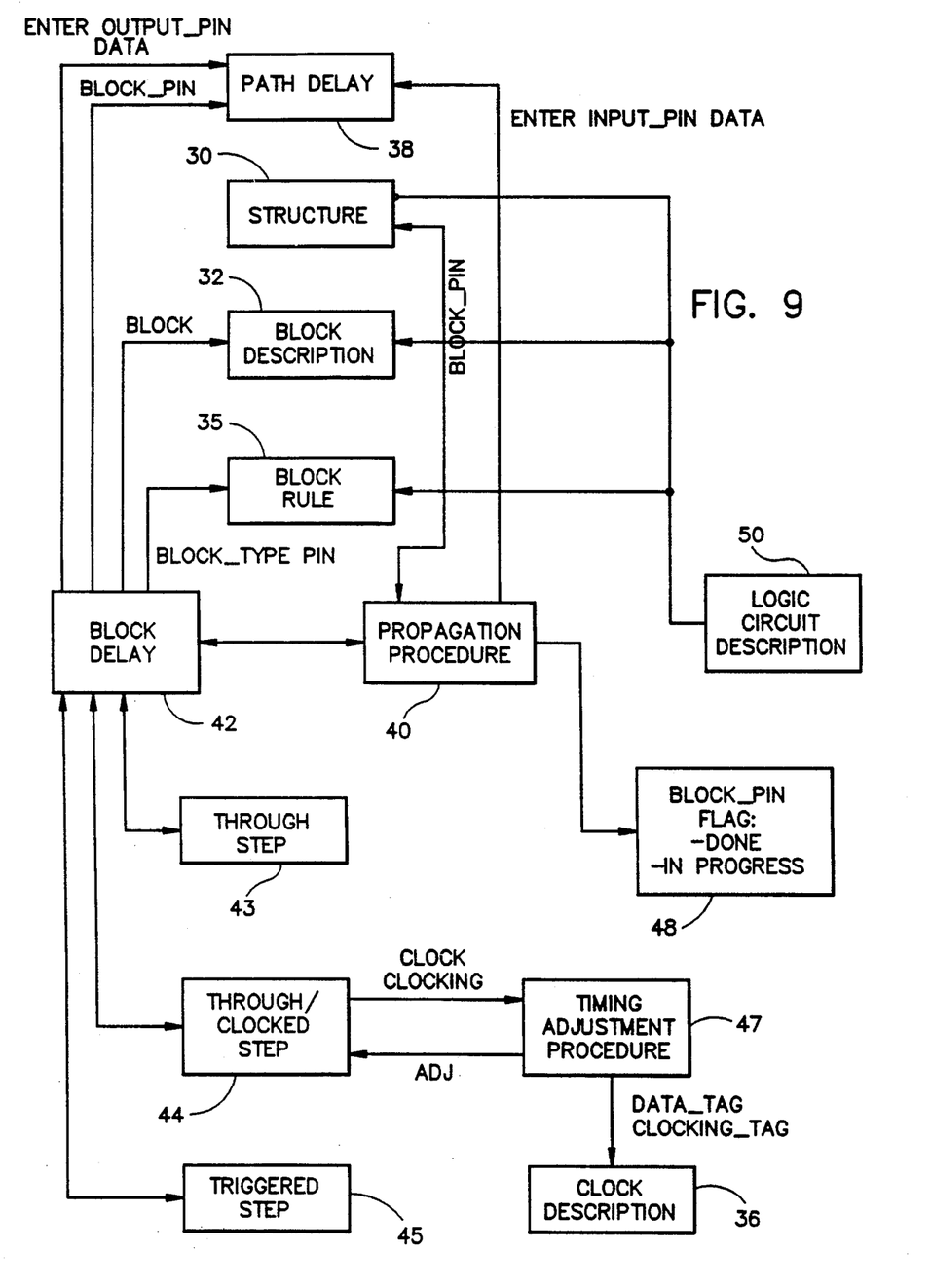
FIG. 9 is a block diagram illustrating the structural relationship of functional elements of the invention.

FIG. 8 illustrates a path delay table 38 containing multi-field data elements representing the cumulative path delays for each input or output pin of every block included in the logic design.

In the path delay table 38 of FIG. 8 the cumulative path delay is included in a multi-field data object with fields identifying the block and pin, and Clock_tag and Path_delay fields. The path delay table is initialized at the beginning of static timing analysis by entry of path delays for all primary inputs of the design. This is indicated in the upper portion of the table 38 which is labeled "primary inputs". As path delays for other pins in the design are determined according to the invention, these values are entered into the lower portion of the table which is labeled "analysis values". The clock tag field of any entry in the path delay table 38 identifies the clocking information which is associated with the path delay value of the entry. In this regard, clocking information denotes information as to the name of a clock for clock signals and information as to the name of the clock which triggered the data for data signals. The clock tag field can have one of three values: ASYNC, name, or name R.

The ASYNC clock tag indicates that the path delay represents an asynchronous signal. An asynchronous signal is a signal without any clock information associated with it. An asynchronous signal cannot be adjusted by the procedures of this invention.

The "name" tag indicates that the path delay is associated with the clock signal "name", where "name" is a clock signal defined in the clock description table 36. Clock signals are assumed to repeat every cycle and may be adjusted according to this invention by the clock cycle length (which, in the example of FIG. 2, is 100 timing units).

The clock tag "name R" indicates that the path delay represents a data signal which was triggered by the leading (rising) edge of the clock "name", where "name" is a clock signal defined in the clock description table 36. Data signals on the data path represented by the pair "name R"/path_delay are assumed to repeat on every cycle of the triggering clock and may be adjusted according to the invention by the clock cycle length.

The Path_delay field of the table 38 includes a pair of numbers of the form (tph, tpl) representing a cumulative delay along a logic circuit path terminating at the pin identified in the Pin field of the table entry. The value tph is the cumulative delay to propagate a logical high signal to block/pin identified in the first two fields of the table entry; tpl is the cumulative delay to propagate a logical low signal to this block/pin. When used herein, the term "cumulative delay" denotes the sum of the block delays along a path from a primary input to the designated pin in the logic design. If there are several paths from a primary input to this pin, or if there are paths from several primary inputs to this pin, then the cumulative delay is the worst (largest) delay for all paths which lead to this pin.

Each pin of a block in the logic design may have multiple entries in the path delay table 38. A given block/pin combination will have an entry in the path delay table for each clock tag which is associated with the block/pin entry. For example, in the analysis value portion of the table 38, two entires are found for the block/pin pair BLK3/D0 (that is, block 3, input pin D0), each to denote a respective clock_ tag/path_delay path which leads to the pin.

FIG. 9 is a block diagram illustrating the primary functional components and data structure which are embraced by the invention, together with the primary structural relationships between those blocks. The invention includes the tables 30, 32, 35, 36, and 38, described above, and function blocks 40, 42, 43, 44, 45, and 47. A set of flags 48 is maintained by the invention.

The invention receives input from a conventional logic circuit description 50 which can be provided by a great number of known and available systems. In the invention, the logic circuit prescription is used to create structure, block, and block rule tables.

In the invention, a propagation procedure 40 receives the description of the next pin for which delay and, if necessary, adjustment are to be determined. The data object passed has block and pin fields which, together, identify the next point in the described logic circuit for which delay and adjustment are to be calculated. The propagation procedure includes a recursive algorithm used to propagate cumulative path delays from the primary inputs to each input and output pin in the described logic circuit. Execution of the propagation procedure makes entries in the path delay table by entering into it the cumulative path delays for all input pins of the described logic circuit. The completed path delay table for the example of FIG. 3 is illustrated in FIG. 8. The propagation procedure works by selecting each block/pin combination in the logic design, determining the cumulative path delay for the combination, and creating entries in the path delay table 38 for the cumulative path delay values to all of the non-primary logic circuit input pins. During execution, the propagation procedure 40 accesses the structure table 30 using the block/pin pair as an index.

The propagation procedure 40 maintains a flag for each block/pin in the logic design to track the status of the block/pin identified by the flag. One such flag is indicated by reference numeral 48. When the block/pin is selected by the propagation procedure, the status of the associated flag is set to IN-PROGRESS. When the cumulative path delay for a block/pin has been calculated, the status of the block/pin is changed to DONE. During execution of the propagation procedure, if a block/pin is selected whose status is IN-PROGRESS, then a loop in the directed graph has been detected. A loop in the directed graph indicates an error condition which is handled by returning an error value as the cumulative path delay for the block/pin where the loop was detected. Following entry of an error value, the propagation procedure continues execution.

The propagation procedure 40 calls a block delay procedure 42 to calculate the delay through a block, determine the cumulative path delay from input to output pin of the block, and create entries in the path delay table for all table entries containing an output pin in the Pin field. During execution, the block delay procedure 42 obtains access to the block description table 32 using the current value of "block" as an index. The data pair block_type/pin indexes the block rule table 35 for the block delay procedure 42. During execution, the block delay procedure 42, or one of its components steps 43, 44, and 45 may access the path delay table 38, using block/pin as the index.

The steps 43, 44, and 45 are routines called by the block delay procedure 42. The THROUGH step 43 determines clock tags and path delay values for a THROUGH path type in a non-triggered circuit element. The THROUGH/clock step 44 determines clock tags and delay values for a through connection from an input pin to the clocked output pin of a clocked circuit element. The TRIGGERED step 45 determines clock tags and delay values for a TRIGGERED connection from a clock input pin to the output pin of a clocked circuit element.

The timing adjustment procedure 47 is called by the THROUGH/clock step 44 to determine whether a timing adjustment is needed to adjust the data signal on the input pin of a latch into the proper relationship with the clock signal on the input pin which triggers the input data pin. Relatedly, the "proper relationship" of the data signal and clock signal requires that the data signal be initiated in the cycle immediately prior to that in which the clock signal occurs. The timing adjustment procedure 47 receives two inputs from the THROUGH/clock step 44, data_tag, which is a clock tag of the data input delay value and clocking_tag, which is the clock tag of the clock signal which triggers the data input pin. The timing adjustment algorithm returns a single value "adj" which is the adjustment amount.

Refer now to tables I-VI for an understanding of the operation of the invention. Assume first that the path delay table 38 has been initialized by entry of the primary input values as illustrated in FIG. 8. Assume that the block/pin pair passed to the propagation procedure 40 is BLK1/30. The propagation procedure 40 will set the flag for this block/pin to IN-PROGRESS and will begin execution according to table I.

EXAMPLE 1

BLK1/30

In table I, the block/pin pair is BLK1/30, for which no cumulative path delay has yet been determined. Pin 30 is an output pin, so the procedure goes to step 2 of table I. At step 2, the propagation procedure calls the block delay procedure of table II to determine the cumulative path for output pin 30 of block 1.

In table II, the block/pin pair still has the value BLK1/30. In step 1 of table II, the block description table 32 is indexed by BLK1 to determine that block 1 is a LATCH. This value is used in step 2 of table II to find all input pins connected to output pin 30 of block 1. As the block rule table 35 indicates, input pin B0 is the sole pin connected to the output pin 30. In step 3, the input pin B0 is returned to the propagation procedure of table I for determination of the cumulative path delay for the block/input_pin pair.

Returning to table I, in step 1, the cumulative path delay for BLK1/B0 has been determined by entry of data in the primary input section of the table during initialization. In this regard, the input pin B0 has a clock_tag/path_delay value of T0/(0,20). At this point, table I returns to step 3 of the block delay procedure.

In step 4 of table II, after return from table I, BLK1/30 indicates that the input pin-to-output pin path type between pin B0 and pin 30 is TRIGGERED. In this case, the output pin 30 is a clocked output pin. The block delay procedure now moves to step 5 of table II.

In step 5, the set of clock tags and delay values for output pin 30 of block 1 are determined for each input pin connected to output pin 30. In the case of block 1, the only input pin connected to the output pin 30 is input pin B0 whose path_type is triggered. Thus, in step 5, the TRIGGERED step (denoted by reference numeral 45 in FIG. 9) is called.

Reference to table V will provide an understanding of the TRIGGERED step in the example under consideration. In the TRIGGERED step, the block/pin pair is still BLK1/30, the input pin is B0 of the path type TRIGGERED, with the number pair (tplh, tphl) equal to (5,6) as shown in the block rule table 35. In step 1 of table V, the cumulative path delays for the input pin B0 of block 1 are given as (0,20). In step 2, clock tag and delay values are created for the output pin 30 from the input pin cumulative path delays. In step 2.a., block_tag and (tph, tpl) have the values T0 (0,20) as illustrated in the primary input section of the path delay table 38. In step 2.b., a new clock tag for the output pin 30 is determined from the input pin clock tag T0. In this case, the second condition of step 2.b. obtains, that is, the clock_tag is T0; therefore, the new_tag is T0 R. Last the path_delay set is created by adding the value for tph to tplh and tphl, respectively. In this case, the path delay value is (0+5,0+6) or (5,6). Thus, the clock_tag/path_delay for output pin 30 of block 1 is T0 R/(5,6). The procedure of table V now returns to step 5.c. of table II.

When return is made to table II, the block delay procedure in step 6 establishes the cumulative path delay for BLK1/30 to the worst delay value for each unique clock tag which is returned. Since only a single input pin affects the signal provided by output pin 30, only one new clock tag is returned in step 5. In this case, in step 6.a., clock_tag is T0 R, while tph_max and tpl_max are the largest (only) rising and falling delays returned by way of step 5. In step 6.b., an entry into the analysis portion of the path delay table 38 is created. Recall that the block and pin field values are BLK1 and 30, respectively. The clock_tag and path_delay values, are, respectively, T0 R and (5,6). Inspection of the entry for BLK1/30 in FIG. 8 will confirm the values developed for this example. It should be evident that the procedural sequence just described for the pair BLK1/30, when performed for the input pair BLK2/30 will give the clock_tag and path_delay values shown in FIG. 8 for that pair.

EXAMPLE 2

BLK4/A0

Consider now use of the invention to determine the delay at input pin A0 of block 4. The block/pin pair BLK4/A0 is passed to the propagation procedure, the related flag is set to IN-PROGRESS, and the procedure of table I is invoked. Since pin A0 is an input pin for which no cumulative path delay has been determined, the procedure drops to step 3. In step 3.a., BLK4/A0 indexes the structure table to find the source block and output pin connected to input pin A0. As the table 30 of FIG. 4 illustrates, this pair is BLK1/30. In step 3.b., the procedure determines the cumulative path delay for BLK1/30 as described in the preceding example, and the path_delay pair (5,6) is returned. In step 3.c., there is only one source_BLK/output_pin pair feeding input pin A0 of block 4. Therefore, when steps 3.c.1 and 2 are executed, the clock_tag/path_delay pair will be T0 R/(5,6). This pair is entered in the path delay table 38 of FIG. 8.

EXAMPLE 3
BLK4/10

When the block/pin pair BLK4/10 is passed to the propagation procedure, the procedure of table I branches to the block delay procedure at step 2. In table II, step 2 returns two input pins which are connected to the output pin 10; these pins are A0 and A1. For *each* of these input pins, table II branches back to the propagation algorithm in step 3 to determine delays for those pins. The previous example demonstrated how the cumulative delay for BLK4/A0 is determined; following the described procedure for BLK4/A1 will result in return of the clock_tag/path_delay pair shown in path delay table for BLK4/A1. The procedure now moves to step 4 of table II, with the two cumulative path delay values for input pins A0 and A1.

Step 4 of table II tells the procedure that the path type is not TRIGGERED; therefore, output pin 10 of block 4 is a non-clocked output pin.

In Step 5, the THROUGH step is selected and executed once for *each* input pin to block 4.

The THROUGH step of table III finds the cumulative path delays for the input pins A0 and A1 from the path delay table 38. For each of the path_delay values returned for the input pins a0 and A1, the block_delay value obtained from the block rule table 35 for the input pin-to-output pin path is added to the path_delay to create a new delay value. Thus, for each input pin, a respective clock_tag/path_delay pair is created for the output pin 10.

Last, the THROUGH step returns to step 6 of table II to set the cumulative path delay for each clock tag returned from the THROUGH step. In this example, there will be two clock tags returned, T0 R for the A0 input and T2 R for the A1 input. Steps 6.a and b take the input clock tags, determine tph_max and tpl_max for each clock tag and make entries into the path delay table for BLK4/10 for the respective clock_tag/path_delay pairs. These entries are shown in FIG. 8 at indexes BLK4/10/T0 R and BLK/10/T2 R.

EXAMPLE 4
BLK3/D0

When the block/pin pair BLK3/D0 is passed to the propagation procedure, the procedure goes to step 3 of table I from where it is determined that pin 10 of block 4 is the only output pin connected to the input pin. The procedure explained above for this output pin is followed, with the result at the clock_tag/path_delay pairs for BLK4/10 in the path delay table are returned. These values are assigned to the two BLK3/D0 entries in the path delay table in steps 3.c.1 and 2 of table I.

EXAMPLE 5
BLK3/10

As discussed above with reference to FIG. 3, output pin 10 of block 3 is clocked by clock signal T1, which requires an adjustment to signal transitions in the output of block 4 which result from transitions in the output pin 30 of block 2. This example illustrates how the static timing analysis procedure of this invention detects the need for, and makes, the adjustment while also determining the cumulative path delay for output pin 10 of block 3. When the block/pin pair BLK3/10 is passed to the propagation procedure, a branch is taken at procedure step 2 to the block delay procedure of table II. In table II, steps 1, 2, and 3 result in determination of the cumulative path delays for the input pins D0 and C0. As the previous example illustrated, two cumulative delay values will be calculated for input D0. The cumulative delay value for C0 is obtained from the primary input section of the path delay table.

Next, in step 4, since input pin C0 is connected to output pin 10 by a TRIGGERED path, the output pin is considered to be a clocked output pin.

The procedure of table II loops at step 5, once for each input pin. Assume the first loop is taken for input pin D0; this will result in invocation of the THROUGH/clocked step of table IV.

In the THROUGH/clocked step, the block/pin pair is BLK3/10, the input_pin is D0, and, from the block rule table, (tplh,tphl) is (2,3).

In step 1 of the THROUGH/clocked step, it is determined that input pin C0 is connected by a TRIGGERED path type to output pin 10. The data pair block/clock_pin has the value BLK3/C0 for which the cumulative path delay from the primary input portion of the path delay table is (25,45). In step 1.c, the set of clock tags which can trigger output pin 10 includes only T1.

Step 2 of table IV returns two cumulative path delays: T0 R/(7,7) and T2 R/(58,58).

In step 3a of table IV, the cumulative path delays of step 2 are formalized into clock_tag/path_delay pairs, while step 3.b returns a value of T1 for the "clocking" parameter. At step 3.c, the value of the clocking parameter, T1, is paired with each cumulative path delay input to pin D0. For each pair, a loop is taken through steps 3.c.1-3.

For the pair (T0,T1), the timing adjustment procedure of table VI is called. The timing adjustment procedure determines whether an adjustment must be made to the cumulative path delay for the data input of a latch because of an apparent timing ambiguity between it and the clock signal which triggers the output pin connected to the data input pin.

For the first pair, the parameter data_tag is given the value T0 in step 1 of the procedure, which results in the "data_cycle" parameter being set to a value of 100 (the cycle length of the clock signal T0) and the parameter "start" to a value of zero (the rise time of the T0 clock signal). In step 2 of the procedure, the parameter "clocking_tag" has a value of T1 which indexes the clock description table to find the rise time and cycle length of the T1 clock signal. The parameter "clocking_cycle" is set to a value of 100 (the cycle length of the T1 clock) while the parameter "expected" is set to a value of 25 (the rise time of the T1 clock signal). In procedure step 3, the greatest common divisor of the current values of the data_cycle and clocking cycle parameters is 100; the parameter "adj_cycle" is assigned this value. In step 4, the following equation is solved for the parameter "n":

$$\text{expected-adj\_cycle} \leq \text{start} + (n*\text{adj\_cycle}) < \text{expected} \quad (1).$$

Substituting the values for the parameters into equation (1) results in:

$$(25-100) \leq 0 + (n*100) < 25$$

and inspection of these values results in assignment of a value of zero to the parameter n. Step 5 of table VI returns to the THROUGH/clocked step procedure at step 3.c.1. Now in procedure step 3.c.2, the new_tag parameter for the *output pin* clock tag is T1 R the delay value for the output pin is calculated as (7+2+0,7+3+0), or (9,10). Therefore, the data pair T1 R/(9,10) is returned.

The procedure now loops back to step 3.c for the pair T2,T1. The first step in the loop calls the timing adjustment procedure of table VI.

When the pair T2,T1 is taken into the adjustment procedure of table VI, data_tag=T2, data_cycle=100, and start=50. Next, in step 2 of the procedure, clocking_tag=T1 indexes the clock description table, with the result that clocking cycle=100, while expected=25. In step 3, adj_cycle 100. In step 4, substitution of the values determined above into equation 1 results in:

$$(25-100) \leq 50 + (n*100) < 25$$

for which n=-1. Thus, in step 5, the parameter "adj" is given the value -100. This value is returned to the THROUGH clocked procedure at step 3.c.1.

Next, a new_tag/path_delay value is determined as T1 R/(-40,-39). At this point, the returned value of -100 for the parameter adj has been used to temporarily adjust the input pin path delay for the T2 R clock tag to a value of -42 as shown in FIG. 3. Relatedly, the clock_tag/path_delay pair T2 R/(58,58) for entry at BLK3/D0 in the path delay table (FIG. 8) can be adjusted in the data provided to the user by adding the adjustment amount returned from the timing adjustment procedure to the path_delay values in the table.

Returning to the determination of the clock_tag/path_delay pair for the output pin 10 of block 3, the two clock tag/path delay pairs are returned to the block delay procedure from the THROUGH/clocked step to step 5.b of table II.

The TRIGGERED step is invoked from block delay procedure step 5.c for the input pin C0, which returns a clock.tag/path.delay pair T1 R/(30,31). The procedure of table II then proceeds to step 6.

In step 6 of table II, the worst delay value is determined by comparing the path_delay values calculated for T0, T2, and T1. Of these values, the T1 pair is the worst (maximum). Thus, in step 6.a, the clock_tag/path_delay pair calculated by the TRIGGERED step is assigned to output pin 10 and the entry is made to the path delay table.

When the procedures explained above are applied to block 5, the path delay table entries of FIG. 8 will be calculated and placed in the table.

It should be evident that the foregoing description and exemplary explanation of the invention are not intended to limit its practice to circuits which consist only of latches and AND gates. The invention is applicable generally to circuits with clocked storage elements and non-clocked combinatorial elements. Further, inspection of the block delay procedure, the linked steps, and the timing adjustment procedure will show that path delay values can be calculated for clocked circuit elements having output pins controlled by any number of input data and clock pins.

One significant advantage of the invention is its ability to maintain, for any block/pin in the logic design, more than one delay value, each for a unique clock tag. See BLK4/10 in FIG. 3 and in the analysis values of the Path Delay Table of FIG. 8. Prior static timing analysis tools could have maintained only a single delay value for any block/pin, and that without a clock tag. The invention permits adjustment for each delay value for any block/pin independent from other delay values occurring at the same block/pin.

TABLE I

Propagation Procedure

Let block/pin be the block and pin that has been selected.
1. If the cumulative path delay for block/pin has already been determined, then no action is needed.
2. If pin is an output pin, then use the block delay procedure to determine the cumulative path delay for the output pin.
3. If pin is an input pin, then:
    a. Use block/pin as indices into the structure table to find the source block "source_blk" and output pin "output_pin" which is connected to the input pin.
    b. Use the block delay algorithm to find the cumulative path delay for source_blk/output_pin.
    c. Set the cumulative path delay for block/pin to the cumulative path delay for source_blk/output_pin by doing the following for each source_blk/output_pin entry in the path delay table:
        1. Let clock_tag be the clock tag and let (tph, tpl) be the path delay for the course_blk/output_pin entry in the path delay table;
        2. Create an entry in the path delay table for block/pin with a clock tag of clock_tag and a path delay of (tph,tpl).

TABLE II

Block Delay Procedure

Let block/pin be a block and output pin.
1. Use "block" as the index into the block description table to find the block type "block_type" of the block.
2. Use block_type and "pin" as indices into the block rule table to find all input pins which are connected to the output pin.
3. For each input pin "input_pin" which is connected to the output pin, use the propagation algorithm to determine the cumulative path delay for block/input_pin.
4. Use block_type and pin as indices into the block rule table to determine if there exists an input pin which is connected to the output pin by a path type of TRIGGERED. If there is, then the output pin is a clocked output pin; otherwise, the output pin is a non-clocked output pin.
5. Determine the set of clock tags and delay values for the output pin. For each input pin which is connected to the output pin, let input_pin be the input pin and let path_type be the path type.
  a. If path_type is THROUGH and the output pin is non-clocked, then use the THROUGH step.
  b. If path_type is THROUGH and the output pin is clocked, then use the THROUGH/clocked step.
  c. If path_type is TRIGGERED, then use the TRIGGERED step.
6. Set the cumulative path delay for block/pin to the worst delay value for each unique clock tag by doing the following for each unique clock tag;
  a. Let clock_tag be the clock tag and let tph_max and tpl_max be the worst (largest) rising and falling delays for the delay values with the clock tag clock_tag;
  b. Create an entry in the path delay table for block/pin with a clock tag of clock_tag and a path delay of (tph_max,tpl_max).

TABLE III

Through Step

Let block/pin be the block and output pin which is being processed. Let input_pin be an input pin connected to the output pin by a path type of THROUGH and let (tplh, tphl) be the block delay value from the block rule table.
1. Use block/input_pin as indices into the path delay table to find all cumulative path delays for the input pin.
2. Create clock tag and delay values for the output pin from the input pin cumulative path delays.
  a. For each cumulative path delay of the input pin, let clock_tag be the clock tag and let (tph,tpl) be the path delay value.
  b. Create a delay value of (tph+tplh,tpl+tphl) with the clock tag clock_tag for the output pin.

TABLE IV

THROUGH/Clocked Step

Let block/pin be the block and output pin which is being processed. Let input_pin be an input pin connected to the output pin by a path type of THROUGH and let (tphl, tphl) be the block delay value from the block rule table.
1. Determine the set of clock tags which can clock the output pin by doing the following;
  a. Use block_type and pin as indices into the block rule table to find all input pins which are connected to the output pin and have a path type of TRIGGERED;
  b. For each input pin clock_pin which is connected to the output pin by a path type of TRIGGERED, use block/clock_pin as indices into the path delay table to find all the clock tags for the cumulative path delays of block/clock_pin;
  c. The set of clock tags which can trigger the output pin is the set of all clock tags for all input pins which are connected to the output pin by a path type of TRIGGERED.
2. Use block/input_pin as indices into the path delay table to find all cumulative path delays for the input pin.
3. Create clock tag and delay values for the output pin from the input pin cumulative path delay values.
  a. For each cumulative path delay of the input pin, let "clock_tag" be the clock tag and let (tph,tpl) be the path delay value b. For each clock tag which can clock the output pin, let "clocking" be the tag which clocks the output pin.
  c. For each pairing of cumulative path delay from the input pin and clocking tag of the output pin do
    1. Use the timing adjustment algorithm to calculate the adjust value "adj" needed to adjust the clock tag of the input pin delay value to the clocking tag.
    2. Determine the new clock tag "new_tag" from the clocking clock tag.
       If clocking is ASYNC then new_tag is ASYNC.
       If clocking is name then new_tag is name R.
       If clocking is name R then new_tag is name R.
    3. Create a delay value of (tph+tplh+adj,tpl+tphl+adj) with the clock tag "new_tag" for the output pin.

TABLE V

Triggered Step

Let block/pin be the block and output pin which is being processed. Let input_pin be an input pin connected to the output pin by a path type of TRIGGERED and let (tplh,tphl) be the block delay value from the block rule table.
1. Use block/input_pin as indices into the path delay table to find all cumulative path delays for the input pin.
2. Create clock tag and delay values for the output pin from the input pin cumulative path delays.
  a. For each cumulative path delay of the input pin, let "clock_tag" be the clock tag and let (tph,tpl) be the path delay value.
  b. Determine the new clock tag "new_tag" from the input pin clock tag clock_tag.
     If clock_tag is ASYNC then new_tag is ASYNC.
     If clock-tag is name then new tag is name R.
     If clock-tag is name R then new_tag is name R.
  c. Create a delay value of (tph+tplh,tph+tphl) with the clock tag new_tag for the output pin.

TABLE VI

Timing Adjustment Procedure

If data_tag or clocking tag is ASYNC then no adjusting is done and the adjustment amount adj is zero.

Otherwise
1. Use data_tag as an index into the clock description table to find the rise time and cycle length of the clock which initiated the data signal. The data signal is assumed to be initiated at the rise of the clock and is assumed to repeat with every cycle of the clock. Let "data_cycle" be the cycle length of the data clock and let "start" be the rise time of the data clock.
2. Use clocking_tag as an index into the clock description table to find the rise time and cycle length of the clock which clocks the data into the latch. The data signal is expected to arrive at the latch before the rising edge of the clock and the rising edge of the clock is assumed to repeat with every cycle. Let "clocking_cycle" be the cycle length of the clock and let "expected" be the rise time of the clock.
3. Determine the greatest common divisor of data_cycle and clocking_cycle. This will be the cycle length by which adjustments can be made. Let this value be "adj_cycle".
4. Find an integer value "n" such that:

expected-adj_cycle < = start + (n*adj_cycle) and
start + (n*adj_cycle) < expected 5. The adjustment amount adj is n*adj_cycle.

While I have described several preferred embodiments of my invention, it should be understood that modifications and adaptations thereof will occur to persons skilled in the art. Therefore, the protection afforded my invention should only be limited in accordance with the scope of the following claims.

I claim:

1. In a programmed computer apparatus for analyzing timing delays in a multi-phase-clock logic network under static conditions, an improvement for analyzing signal delay through the logic network, the improvement comprising:

simulating means for providing a logical counterpart of the logic network which represents a multi-phase clock, elements of the logic network and connections between those elements, the elements including clocked elements which respond to the multi-phase clock by storing data signals;

a data object representing a data signal propagating in the logic network, the data object including a first data field representing a phase of the multi-phase clock during which a data signal is clocked by the logic network and a second data field representing a time by which the data signal is delayed by propagation in the logic circuit;

propagating means for applying the data object to a representation of a clocked element in the logic network, the clocked element being triggered by a particular phase of the multi-phase clock; and delay means connected to the propagating means for comparing the phase represented by the first data field with a representation of the particular phase to change the second field to a path delay value representing the cumulative delay of the data signal through the clocked element.

2. The improvement of claim 1 further including, in the delay means, an adjustment means for comparing the phase represented by the first data field with the representation of the particular phase to produce an adjustment value by which the second field is adjusted.

3. The improvement of claim 1 further including, in the data object, a clock edge representation corresponding to an edge of the particular phase of the multi-phase clock which triggers the clocked element.

4. A static timing analysis system, including a programmed computer apparatus for analyzing timing delays in a logic design, comprising:

means in the programmed computer apparatus for simulating a logic design by providing representations of a logic clock, logic elements, and connections between the logic elements, the logic elements including clocked elements triggered by the logic clock;

a signal representation in the programmed computer apparatus of a signal propagating in the logic design, the signal representation including a clock tag identifying a first phase of the logic clock during which the signal is clocked in the logic design;

propagating means in the programmed computer apparatus for applying the signal representation to a representation of a clocked element in the logic design, the clocked element being triggered by a second phase of the logic clock to move the signal to an output of the clocked element; and delay means in the programmed computer apparatus connected to the propagating means and responsive to the clock tag for comparing the first phase and second phase to produce a representation of the cumulative delay of the signal representation through the clocked elements.

5. The static timing analysis system of claim 4 wherein the signal representation includes a path delay having a value representing a cumulative propagation delay of the signal up to the clocked element.

6. The static timing analysis system of claim 5 wherein the delay means produces the representation of cumulative delay by combining the cumulative propagation delay with a block delay representing a signal delay through the clocked element for the signal.

7. The static timing analysis system of claim 6 wherein the delay means is further for placing the representation of the cumulative delay in the path delay.

8. The static timing analysis system of claim 4 wherein the representation of the cumulative delay includes a first value representing a cumulative delay to propagate a logical high signal and a second value representing a cumulative delay to propagate a logical low signal.

9. The static timing analysis system of claim 4 further including, in the delay means, an adjustment means for comparing the first and second phases to produce an adjustment value for adjusting the cumulative delay to account for a clock cycle difference between the first and second phases.

10. A computer-implemented method for conducting static timing analysis of a logic design, the logic design including a multi-phase logic clock, circuit logic elements, and connections between the circuit logic elements, the circuit logic elements including clocked elements which are triggered by the multi-phase clock, the method including the steps of:

representing a first signal in the logic design with a first data object including a first field containing a clock value representing a clock phase during which the first signal is clocked in the logic design and a second field containing a time value representing a time by which the first signal is delayed in the logic design;

simulating the application of the first signal to an input pin of a clocked element which is triggered by a particular phase of the multi-phase clock;

determining a cumulative delay value representing the cumulative delay of the first signal at an output pin of the clocked element in response to the clock phase in the first field and the particular phase; and changing the first field to a value representing the particular phase and changing the second field value to the cumulative delay value.

11. The method of claim 10, further including:

comparing the clock value with the particular phase to determine whether the clock phase apparently occurs later than the particular phase; and if the clock phase apparently occurs later than the particular phase, adjusting the time value to a value occurring before the particular phase.

12. In a computer apparatus programmed for analyzing timing delays in a multi-phase-clock logic network under static conditions, an improvement for analyzing signal delay through the logic network, the improvement comprising:

simulating means for providing a logical counterpart of the logic network which represents a multi-phase clock, elements of the logic network and connections between those elements, the elements including clocked elements which respond to the multi-phase clock by storing data signals;

a first data object representing a data signal propagating from an element in the logic network, the first data object including a first data field representing a first phase of the multi-phase clock during which said data signal is clocked by the logic network and a second data field representing a first time by which the data signal is delayed in the logic network;

a second data object representing said data signal, the second data object including a first data field representing a second phase of the multi-phase check during which said data signal is clocked by the logic network and a second data field representing a second time by which the data signal is delayed in the logic network;

propagating means for applying the first and second data objects to a representation of a clocked element being triggered by a third phase of the multi-phase clock; and delay means connected to the propagating means for comparing the first and second phases represented by the first fields in the first and second data objects, respectively, with a representation of the third phase to change the second field of the first or second data object to a path delay value representing the cumulative delay value of the data signal through the clocked element.

13. The improvement of claim 12, wherein the delay means includes an adjustment means for comparing the first phase with the third phase to produce an adjustment value by which the second field of the first data object is changed.

14. The improvement of claim 13 wherein the adjustment value is a multiple of a multi-phase clock cycle time.

* * * * *

UNITED STATES PATENT AND TRADEMARK OFFICE
CERTIFICATE OF CORRECTION

PATENT NO. : 5,210,700

DATED : May 11, 1993

INVENTOR(S) : David Tom

It is certified that error appears in the above-identified patent and that said Letters Patent is hereby corrected as shown below:

Column 19, line 17, please change "check" to --clock--.

Signed and Sealed this

First Day of February, 1994

Attest:

BRUCE LEHMAN

*Attesting Officer*     *Commissioner of Patents and Trademarks*